(12) United States Patent
Song et al.

(10) Patent No.: US 12,150,333 B2
(45) Date of Patent: Nov. 19, 2024

(54) DISPLAY PANEL AND PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Li Song, Beijing (CN); Zhiliang Jiang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 150 days.

(21) Appl. No.: 16/901,018

(22) Filed: Jun. 15, 2020

(65) Prior Publication Data

US 2021/0193960 A1   Jun. 24, 2021

(30) Foreign Application Priority Data

Dec. 19, 2019   (CN) .......................... 201911319660.5

(51) Int. Cl.
  *H10K 50/844*   (2023.01)
  *H10K 59/122*   (2023.01)
  (Continued)

(52) U.S. Cl.
  CPC ......... *H10K 50/844* (2023.02); *H10K 59/122* (2023.02); *H10K 59/124* (2023.02); *H10K 59/1201* (2023.02)

(58) Field of Classification Search
  CPC ............. H01L 51/5253; H01L 27/3246; H01L 24/3258; H01L 2227/323; H10K 50/844;
  (Continued)

(56) References Cited

U.S. PATENT DOCUMENTS

| 2020/0013971 A1* | 1/2020 | Park | ...................... H10K 50/844 |
| 2020/0194534 A1* | 6/2020 | Park | ...................... H10K 59/131 |
| 2021/0134928 A1* | 5/2021 | Bang | ..................... H10K 59/124 |

FOREIGN PATENT DOCUMENTS

| CN | 108962953 | * | 7/2018 | ............. H01L 51/52 |
| CN | 108962963 | * | 7/2018 | ............. H01L 51/52 |

(Continued)

OTHER PUBLICATIONS

Office Action dated Nov. 12, 2021 for Chinese Patent Application No. 201911319660.5 and English Translation.

*Primary Examiner* — Vongsavanh Sengdara
(74) *Attorney, Agent, or Firm* — Ling Wu; Stephen Yang; Ling and Yang Intellectual Property

(57) ABSTRACT

Provided are a display panel and a preparation method thereof, and a display apparatus. The display panel includes a display area and a frame area located at a side of the display area, wherein the frame area includes a transition area close to the display area and an outer edge area remote from the display area, the transition area is of a structure comprising a base structure layer, an insulating layer disposed on the base structure layer, a construction structure disposed on the insulating layer, and a first inorganic encapsulation layer and an organic encapsulation layer sequentially disposed on the construction structure, and the first inorganic encapsulation layer has a concave-convex structure.

20 Claims, 6 Drawing Sheets

(51) Int. Cl.
*H10K 59/124* (2023.01)
*H10K 59/12* (2023.01)

(58) Field of Classification Search
CPC . H10K 59/1201; H10K 59/122; H10K 59/124
See application file for complete search history.

(56) References Cited

FOREIGN PATENT DOCUMENTS

| | | |
|---|---|---|
| CN | 108962953 A | 12/2018 |
| CN | 110120463 A | 8/2019 |
| KR | 10-2019-0030951 A | 3/2019 |

* cited by examiner

DISPLAY PANEL AND PREPARATION METHOD THEREOF, AND DISPLAY APPARATUS

CROSS-REFERENCE TO RELATED APPLICATION

The present application claims the priority of Chinese patent application No. 201911319660.5 filed to the CNIPA on Dec. 19, 2019, the content of which is hereby incorporated by reference.

TECHNICAL FIELD

The present disclosure relates to, but is not limited to the technical field of display, specifically to a display panel and a preparation method thereof, and a display apparatus.

BACKGROUND

An organic light emitting diode (OLED) is an active light emitting display device, which has advantages such as self-luminescence, a wide viewing angle, a high contrast, a lower power consumption, and a fast reaction speed, etc. OLED displays are widely accepted by customers, because of advantages of the OLED displays such as bright colors, low power consumption, thinness, flexibility, etc. With continuous development of display technologies, OLED technologies are increasingly applied in various display apparatuses, particularly in smart terminal products such as mobile phones and tablet computers, etc.

Organic light-emitting materials and cathode materials used in an OLED device are particularly sensitive to moisture and oxygen, and excessive humidity or too high oxygen content will both affect service life of the OLED device. In order to ensure the life of an OLED device, an OLED display is generally encapsulated in an inorganic-organic-inorganic Hamburg structure, and the encapsulating technology is called a thin film encapsulation technology. When thin film encapsulation is performed on the OLED display, a first encapsulation layer and a third encapsulation layer are both inorganic encapsulation layers which may be prepared by deposition using a metal mask, and a second encapsulation layer is an organic encapsulation layer which may be prepared by using a method of ink jet printing. The organic encapsulation layer is liquid before being cured and has higher fluidity. It is easy to overflow at a location such as an abnormal area, a corner, etc., of a display panel. This results in that encapsulation effect of the OLED device becomes poor, and that service life of the OLED device is reduced.

SUMMARY

The following is a summary of subject matter described in detail herein. This summary is not intended to limit the scope of protection of the claims.

In one aspect, the present disclosure proposes a display panel, including a display area and a frame area located at a side of the display area, wherein the frame area includes a transition area close to the display area and an outer edge area remote from the display area, the transition area of the display panel is of a structure including a base structure layer, an insulating layer disposed on the base structure layer, a construction structure disposed on the insulating layer, and a first inorganic encapsulation layer and an organic encapsulation layer sequentially disposed on the construction structure, and the first inorganic encapsulation layer has a concave-convex structure in the transition area.

In some possible implementations, the construction structure includes a first structure layer disposed on the insulating layer, the first structure layer is provided with a groove on a side facing the first inorganic encapsulation layer, and the first inorganic encapsulation layer has a concave-convex structure.

In some possible implementations, the groove is one of multiple grooves, and the multiple grooves are sequentially disposed in parallel in a direction from the display area towards the outer edge area.

In some possible implementations, the construction structure further includes a second structure layer superposed on a side of the first structure layer away from the insulating layer, the second structure layer includes a columnar body, and the columnar body is disposed between two adjacent grooves.

In some possible implementations, the columnar body has a width smaller than a distance between two grooves adjacent to the columnar body, a concave part and a convex part of a concave-convex structure are connected through a stepped connecting wall, and the width is a size of the columnar body in a direction along which the multiple grooves are arranged.

In some possible implementations, the display area of the display panel is of a structure including a base structure layer, a driving structure layer disposed on the base structure layer, a planarization layer disposed on the driving structure layer, and a pixel definition layer disposed on the planarization layer, the first structure layer is disposed on a same layer as the planarization layer, and the columnar body is disposed on a same layer as the pixel definition layer.

In some possible implementations, the construction structure includes a first structure layer disposed on the insulating layer and a second structure layer disposed on a side of the first structure layer away from the insulating layer, a side of the first structure layer facing the first inorganic encapsulation layer has a planarized surface, the second structure layer includes a columnar body, and the first inorganic encapsulation layer has a concave-convex structure.

In some possible implementations, the display area of the display panel is of a structure including a base structure layer, a driving structure layer disposed on the base structure layer, a planarization layer disposed on the driving structure layer, and a pixel definition layer disposed on the planarization layer, the first structure layer is disposed on a same layer as the planarization layer, and the columnar body is disposed on a same layer as the pixel definition layer.

In some possible implementations, the construction structure includes a second structure layer disposed on the insulating layer, the second structure layer includes multiple columnar bodies which are sequentially disposed at intervals, the first inorganic encapsulation layer has a concave-convex structure, the display area of the display panel is of a structure including a base structure layer, a driving structure layer disposed on the base structure layer, a planarization layer disposed on the driving structure layer, and a pixel definition layer disposed on the planarization layer, and the second structure layer is disposed on a same layer as the pixel definition layer.

In another aspect, the present disclosure also proposes a preparation method of a display panel, wherein the display panel includes a display area and a frame area located at a side of the display area, and the frame area includes a transition area close to the display area and an outer edge area remote from the display area, and the method includes:

forming a base structure layer; forming an insulating layer located in the transition area on the base structure layer; sequentially forming a construction structure and a first inorganic encapsulation layer located on the insulating layer in the transition area, the first inorganic encapsulation layer having a concave-convex structure; and forming an organic encapsulation layer located on the first inorganic encapsulation layer by using an ink jet printing process.

In some possible implementations, sequentially forming the construction structure and the first inorganic encapsulation layer located on the insulating layer in the transition area, the first inorganic encapsulation layer having the concave-convex structure, includes: forming a planarization film on the insulating layer, performing patterning processing on the planarization film, and forming a planarization layer located in the display area and a first structure layer located in the transition area, wherein the first structure layer is provided with a groove on a side facing the first inorganic encapsulation layer; and forming the first inorganic encapsulation layer on the first structure layer, the first inorganic encapsulation layer having a concave-convex structure in the transition area.

In some possible implementations, forming the first inorganic encapsulation layer on the first structure layer, the first inorganic encapsulation layer having the concave-convex structure in the transition area, includes: forming a pixel definition film on the planarization layer and the first structure layer, performing patterning processing on the pixel definition film, forming a pixel definition layer in the display area, and forming a second structure layer superposed on the first structure layer in the transition area, wherein the second structure layer includes a columnar body, and the columnar body is located between two adjacent grooves; and forming the first inorganic encapsulation layer on the pixel definition layer and the second structure layer, wherein the first inorganic encapsulation layer has a concave-convex structure in the transition area.

In some possible implementations, sequentially forming the construction structure and the first inorganic encapsulation layer located on the insulating layer in the transition area, the first inorganic encapsulation layer having the concave-convex structure, includes: forming a planarization film on the insulating layer, performing patterning processing on the planarization film by using a halftone mask, removing part of the planarization film located in the display area to form a planarization layer, and removing part of the planarization film located in the transition area to form a first structure layer and a second structure layer located on a side of the first structure layer away from the insulating layer, wherein the first structure layer is provided with multiple grooves on a side facing the first inorganic encapsulation layer, the second structure layer includes a columnar body, and the columnar body is located between two adjacent grooves; forming a pixel definition film on the planarization layer and the second structure layer, performing patterning processing on the pixel definition film, forming a pixel definition layer located in the display area, and removing the pixel definition film in the transition area; and forming a first inorganic encapsulation layer on the pixel definition layer, wherein the first inorganic encapsulation layer has a concave-convex structure in the transition area.

In some possible implementations, sequentially forming the construction structure and the first inorganic encapsulation layer located on the insulating layer in the transition area, the first inorganic encapsulation layer having the concave-convex structure, includes: sequentially forming a planarization film and a pixel definition film located on the insulating layer in the transition area; performing patterning processing on the pixel definition film and the planarization film by using a halftone mask, and removing part of the pixel definition film and part of the planarization film in the transition area to form a first structure layer and a second structure layer located on a side of the first structure layer away from the insulating layer, wherein the first structure layer is provided with multiple grooves on a side facing the first inorganic encapsulation layer, the second structure layer includes a columnar body, and the columnar body is located between two adjacent grooves; and forming the first inorganic encapsulation layer on the second structure layer, wherein the first inorganic encapsulation layer has a concave-convex structure in the transition area.

In some possible implementations, sequentially forming the construction structure and the first inorganic encapsulation layer located on the insulating layer in the transition area, the first inorganic encapsulation layer having the concave-convex structure, includes: forming a planarization film on the insulating layer, performing patterning processing on the planarization film, reserving the planarization film in the display area to form a planarization layer, reserving the planarization film at a location of the construction structure to form a first structure layer, wherein a side of the first structure layer facing the first inorganic encapsulation layer has a planarized surface; and forming a pixel definition film on the planarization layer and the first structure layer, performing patterning processing on the pixel definition film, forming a pixel definition layer in the display area, and forming a second structure layer superposed on the first structure layer in the transition area, wherein the second structure layer includes a columnar body, and the first inorganic encapsulation layer has a concave-convex structure.

In some possible implementations, sequentially forming the construction structure and the first inorganic encapsulation layer located on the insulating layer in the transition area, the first inorganic encapsulation layer having the concave-convex structure, includes: forming a planarization film on the insulating layer, performing patterning processing on the planarization film, forming a planarization layer located in the display area, and removing a planarization film in the transition area; and forming a pixel definition film on the planarization layer, performing patterning processing on the pixel definition film, forming a pixel definition layer in the display area, and forming a second structure layer located on the insulating layer in the transition area, wherein the second structure layer includes a columnar body, and the first inorganic encapsulation layer has a concave-convex structure.

In yet another aspect, the present disclosure provides a display apparatus, including a display panel, wherein the display panel includes a display area and a frame area located at a side of the display area, the frame area includes a transition area close to the display area and an outer edge area remote from the display area, the transition area of the display panel is of a structure including a base structure layer, an insulating layer disposed on the base structure layer, a construction structure disposed on the insulating layer, and a first inorganic encapsulation layer and an organic encapsulation layer sequentially disposed on the construction structure, and the first inorganic encapsulation layer has a concave-convex structure in the transition area.

In some possible implementations, the construction structure includes a first structure layer disposed on the insulating layer, the first structure layer is provided with a groove on a side facing the first inorganic encapsulation layer, and the first inorganic encapsulation layer has a concave-convex structure.

In some possible implementations, the construction structure includes a first structure layer disposed on the insulating layer and a second structure layer disposed on a side of the first structure layer away from the insulating layer, a side of the first structure layer facing the first inorganic encapsulation layer has a planarized surface, the second structure layer includes a columnar body, and the first inorganic encapsulation layer has a concave-convex structure.

In some possible implementations, the construction structure includes a second structure layer disposed on the insulating layer, the second structure layer includes multiple columnar bodies which are sequentially disposed at intervals, the first inorganic encapsulation layer has a concave-convex structure, the display area of the display panel is of a structure including a base structure layer, a driving structure layer disposed on the base structure layer, a planarization layer disposed on the driving structure layer, and a pixel definition layer disposed on the planarization layer, and the second structure layer is disposed on a same layer as the pixel definition layer.

Other features and advantages of technical solutions of the present disclosure will be set forth in the description which follows, and in part will become apparent from the description, or be learned by practice of the technical solutions of the present disclosure. Purposes and advantages of the technical solutions of the present disclosure may be realized and obtained by structures specifically pointed out in the specification and drawings.

Other aspects will become apparent upon reading and understanding accompanying drawings and the detailed description.

BRIEF DESCRIPTION OF DRAWINGS

Accompanying drawings are used to provide a further understanding of technical solutions of the present disclosure and form a part of the specification. Together with embodiments of the present disclosure, they are used to explain technical solutions of the present disclosure and do not constitute a limitation on the technical solutions of the present disclosure.

DETAILED DESCRIPTION

In order to make purposes, technical solutions and advantages of the present disclosure clearer, embodiments of the present disclosure will be described in detail below with reference to the accompanying drawings. Those skilled in the art should understand that embodiments in the present disclosure and features in the embodiments may be combined with each other arbitrarily if there is no conflict.

Figure 1:
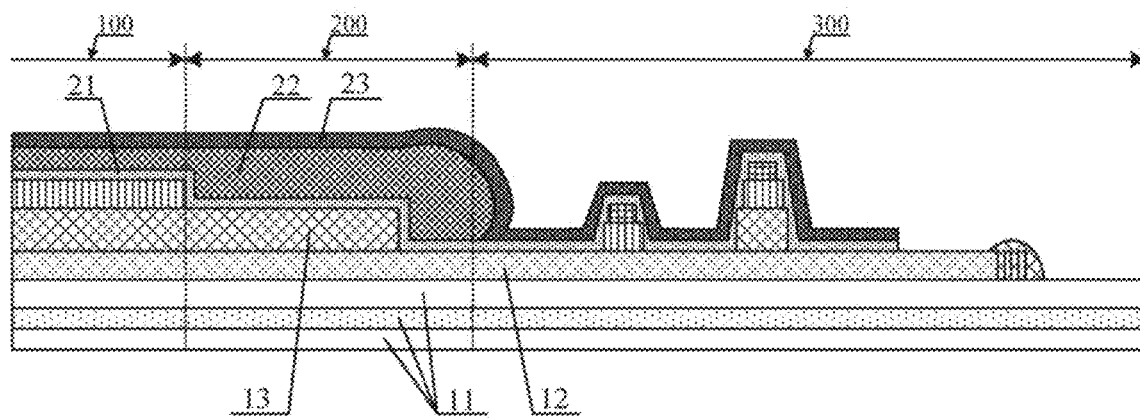
FIG. 1 is a cross-sectional view of a frame area of an OLED display panel.

FIG. 1 is a cross-sectional view of a frame area of an OLED display panel. The OLED display panel includes a display area 100 and a frame area. As shown in FIG. 1, a structure of the display area may use a structure of an OLED display panel known in the art, an upper side of the display area 100 is an encapsulation structure layer, and the encapsulation structure layer sequentially includes a first inorganic encapsulation layer 21, an organic encapsulation layer 22 and a second inorganic encapsulation layer 23. The organic encapsulation layer 22 is formed by using an ink jet printing process, and an organic encapsulation material is ink jet printed in the display area. Before being cured, the organic encapsulation material will flow from the display area to the frame area. The frame area includes a transition area 200 close to the display area 100 and an outer edge area 300 remote from the display area 100. The transition area 200 is configured to provide an area for the organic encapsulation material to flow, and the organic encapsulation material will flow to the transition area 200. Therefore, a structure of the transition area 200 includes a base structure layer 11, an insulating layer 12 disposed on the base structure layer 11, a planarization layer 13 disposed on the insulating layer 12, and a first inorganic encapsulation layer 21, an organic encapsulation layer 22 and a second inorganic encapsulation layer 23 which are sequentially disposed on the planarization layer 13. In the related art, a liquid organic encapsulation material is formed on the first inorganic encapsulating layer 21 by using a method of ink jet printing, and the liquid organic encapsulation material forms the organic encapsulating layer 22 after being cured. Before being cured, the liquid organic encapsulation material has higher fluidity, and it is easy for the liquid organic encapsulation material to overflow from the transition area at locations such as abnormal areas, corners, etc., of the display panel. As shown in FIG. 1, in FIG. 1, the liquid organic encapsulation material overflows from the transition area to the outer edge area. This results in that encapsulation effect of the OLED device becomes poor, and that service life of the OLED device is reduced.

The present disclosure proposes a display panel. The display panel includes a display area and a frame area located at a side of the display area, the frame area includes a transition area close to the display area and an outer edge area remote from the display area, the transition area of the display panel is of a structure including a base structure layer, an insulating layer disposed on the base structure layer, a construction structure disposed on the insulating layer, and a first inorganic encapsulation layer and an organic encapsulation layer sequentially disposed on the construction structure, and the first inorganic encapsulation layer has a concave-convex structure.

According to the display panel provided by the present disclosure, the first inorganic encapsulation layer has the concave-convex structure in the transition area. Thereby, after a liquid organic encapsulation material is formed on the first inorganic encapsulation layer by using an ink jet printing process, before the liquid organic encapsulation material is cured, a concave part of the concave-convex structure may accommodate the excess part of the liquid organic encapsulation material, and a convex part of the concave-convex structure may effectively block climbing of the liquid organic encapsulation material and slow down flow of the liquid organic encapsulation material. This effectively prevents the liquid organic encapsulation material from overflowing to the outer edge area, ensures encapsulation reliability of the organic encapsulation layer, and improves encapsulation effect.

Technical contents of the present disclosure will be described in detail below through specific embodiments.

Figure 2:
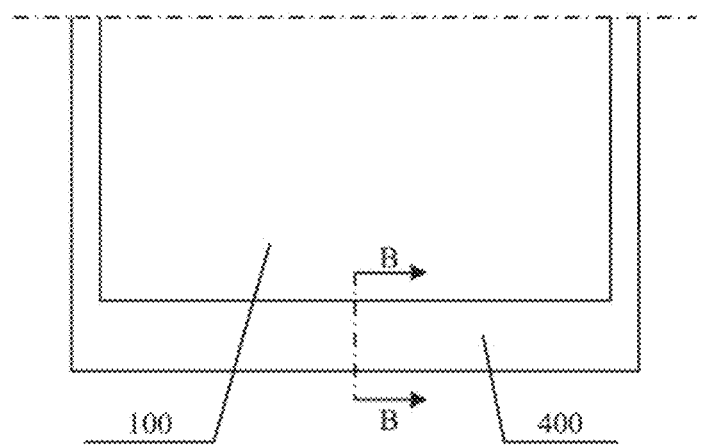
FIG. 2 is a plane view of a structure of a display panel in an exemplary embodiment of the present disclosure.
Figure 3:
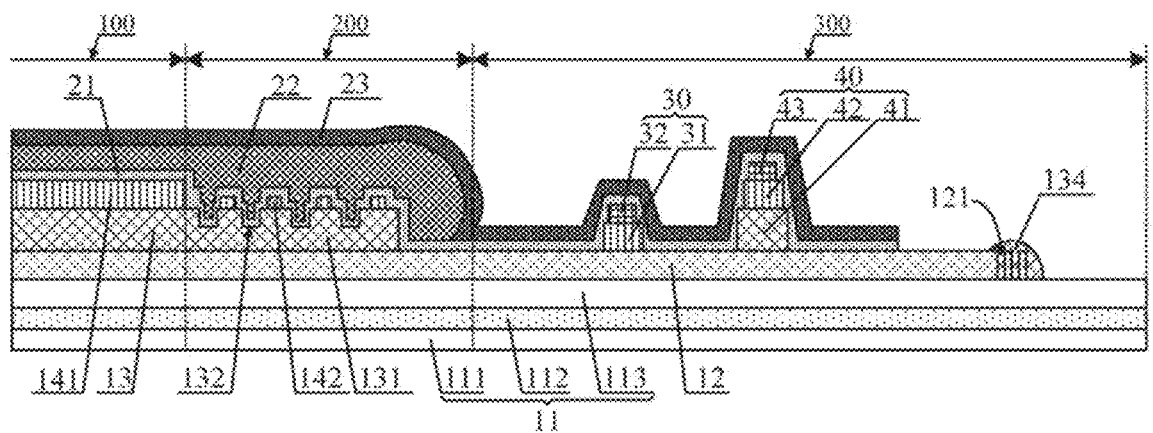
FIG. 3 is a cross-sectional view taken along line B-B of FIG. 2.

FIG. 2 is a plane view of a structure of a display panel in an exemplary embodiment of the present disclosure, and FIG. 3 is a cross-sectional view taken along line B-B of FIG. 2. As shown in FIG. 2, the display panel may be an OLED display panel, the OLED display panel includes a display area 100 and a frame area 400, and the frame area 400 includes a transition area 200 close to the display area 100 and an outer edge area 300 remote from the display area. The transition area 200 of the display panel is of a structure including a base structure layer 11, an insulating layer 12 disposed on the base structure layer 11, a construction structure disposed on the insulating layer 12, and a first inorganic encapsulation layer 21 and an organic encapsulation layer 22 sequentially disposed on the construction structure. The organic encapsulation layer 22 is formed by using an ink jet printing process. The first inorganic encapsulation layer 21 has a concave-convex structure in the transition area.

According to the display panel of the present disclosure, the first inorganic encapsulation layer 21 has the concave-convex structure in the transition area. Thereby, after a liquid organic encapsulation material is formed on the first inorganic encapsulation layer 21 by using an ink jet printing process, before the liquid organic encapsulation material is cured, a concave part of the concave-convex structure may accommodate the excess part of the liquid organic encapsulation material, and a convex part of the concave-convex structure may effectively block climbing of the liquid organic encapsulation material and slow down flow of the liquid organic encapsulation material. This effectively prevents the liquid organic encapsulation material from overflowing, ensures encapsulation reliability of the organic encapsulation layer, and improves encapsulation effect.

Compared with the display panel shown in FIG. 1, a display panel shown in FIG. 3 has a concave-convex structure. Thereby, before a liquid organic encapsulation material is cured, a concave part accommodates the excess part of the liquid organic encapsulation material, and a convex part effectively blocks climbing of the liquid organic encapsulation material and slows down flow of the liquid organic encapsulation material. This effectively prevents the liquid organic encapsulation material from overflowing to an outer edge area, improves encapsulation reliability of the organic encapsulation layer, improves encapsulation effect, improves performance of the product, and prolongs service life of the product.

In an exemplary embodiment, the concave-convex structure may be disposed, as required, at a location where the liquid organic encapsulation material is easy to overflow, e.g., a location such as an area within a lower frame, an abnormal area, a corner, etc., of the display panel.

Herein, specific cross-sectional shapes of the concave part and the convex part of the concave-convex structure are not limited, and may be determined according to an actual requirement, for example, the concave-convex structure may be serrated or wavy, the cross-sectional shape of the concave part may be trapezoidal, rectangular, arc, etc. A specific shape of the construction structure may be determined according to a shape of the concave-convex structure.

In an exemplary embodiment, as shown in FIG. 3, the construction structure may include a first structure layer 131 disposed on the insulating layer 12, and the first structure layer 131 is provided with a groove 132 on a side facing the first inorganic encapsulation layer, thereby making a subsequently formed first inorganic encapsulation layer 21 have a concave-convex structure in the transition area. The groove 132 may be a single groove or one of multiple grooves. When the groove 132 is one of multiple grooves, the multiple grooves 132 are sequentially disposed in parallel in a direction from the display area 100 towards the outer edge area 300. Therefore, the multiple grooves may sequentially accommodate the excess part of the liquid organic encapsulation material, and further prevent the organic encapsulation material from overflowing to the outer edge area 300.

In order to make the groove to more fully accommodate the excess part of the liquid organic encapsulation material, the groove 132 may be extended along a direction parallel to a boundary line of the display area and the transition area, that is, the groove 132 is in a strip shape, and the groove 132 is extended along an extension direction of the transition area. For example, if the transition area is disposed around the display area, the groove 132 is also disposed around the display area.

The cross-sectional shape of the groove 132 may be trapezoidal, rectangular, arc, etc., and a specific shape may be determined according to an actual requirement.

In an exemplary embodiment, as shown in FIG. 3, the construction structure may further include a second structure layer, wherein the second structure layer is disposed on a side of the first structure layer 131 away from the insulating layer 12. The groove 132 is one of multiple grooves, the multiple grooves 132 are sequentially disposed in parallel in a direction from the display area 100 towards the outer edge area 300, and the multiple grooves 132 are disposed at even intervals. The second structure layer includes a columnar body 142, and the columnar body 142 is located between two adjacent grooves 132. A quantity of the columnar body 142 may be matched with a quantity of the grooves 132, and multiple columnar bodies 142 each are sequentially disposed between two adjacent grooves 132. The columnar body 142 is also in a stripe shape, and the columnar body 142 may be extended along a direction parallel to a boundary line between the display area and the transition area, that is, the columnar body 142 is extended along a direction parallel to the groove 132. The arrangement of the columnar body 142 may make a height difference between the concave and the convex of the concave-convex structure of the first inorganic encapsulation layer 21 to be subsequently formed increase. Thereby the concave part of the concave-convex structure is deeper, the convex part is higher, the deeper concave part may accommodate more liquid organic encapsulation materials, the higher convex part may more effectively block climbing of the liquid organic encapsulation material and further slow down flow of the liquid organic encapsulation material, and this avoids overflow of the liquid organic encapsulation material. The cross-sectional shape of the columnar body 142 may be trapezoidal, rectangular, triangular, semicircular, etc., and a specific shape may be determined according to an actual requirement.

In an exemplary embodiment, as shown in FIG. 3, the concave part and the convex part of the concave-convex structure of the first inorganic encapsulation layer 21 are connected through a stepped connecting wall. Such a structure may further improve climbing resistance of the concave-convex structure to the liquid organic encapsulation material and further slow down flow of the liquid organic encapsulation material, and this avoids overflow of the liquid organic encapsulation material.

As shown in FIG. 3, the columnar body 142 has a width smaller than a distance between two grooves 132 adjacent to the columnar body 142, so that when the first inorganic encapsulation layer 21 is subsequently formed, the concave part and the convex part of the obtained concave-convex structure are connected through a stepped connecting wall. Herein, the width of the columnar body is a size of the columnar body in a direction along which the multiple grooves are arranged, and in FIG. 3, the width of the columnar body is a size of the columnar body in a direction along the width of the paper.

As shown in FIG. 3, the display panel further includes a second inorganic encapsulation layer 23 covering the organic encapsulation layer 22.

Those skilled in the art may understand that the display area of the display panel may be of a structure including a base structure layer 11, a driving structure layer disposed on the base structure layer 11, a planarization layer 13 disposed on the driving structure layer, and a pixel definition layer 141 disposed on the planarization layer 13. The driving structure layer includes a thin film transistor, and in a process of forming the driving structure layer, an insulating layer 12 located in the transition area is simultaneously formed. The first structure layer 131 may be disposed on a same layer as the planarization layer of the display area, that is, the first structure layer 131 and the planarization layer 13 are formed by a one-time patterning process. In an embodiment, as shown in FIG. 3, the second structure layer is disposed on a same layer as the pixel definition layer, that is, the columnar body 142 and the pixel definition layer of the display area are formed by a one-time patterning process. A side surface of the columnar body 142 away from the base structure layer is close to the base structure layer with respect to a side surface of the pixel definition layer 141 away from the base structure layer, that is, an upper surface of the columnar body 142 is lower than an upper surface of the pixel definition layer 141. In another embodiment, the upper surface of the columnar body may also be flush with the upper surface of the pixel definition layer.

As shown in FIG. 3, the outer edge area of the display panel is of a structure including a base structure layer 11, an insulating layer 12 disposed on the base structure layer 11, and a first bank 30 and a second bank 40 disposed on the insulating layer 12. The second bank 40 is located on a side of the first bank 30 away from the display area. In an exemplary embodiment, a height of the second bank 40 is greater than a height of the first bank 30, where "height" is a size of the bank in a direction perpendicular to the display panel. The structure of the outer edge area further includes a first inorganic encapsulation layer 21 and a second inorganic encapsulation layer 23 which sequentially cover the first bank 30 and the second bank 40. The first bank 30 and the second bank 40 may play a protective role to block the liquid organic encapsulation material, and this prevents the organic liquid encapsulation material from overflowing to an outer edge location of the display panel. The first bank 30 and the second bank 40 may extend encapsulation paths of the first inorganic encapsulation layer 21 and the second inorganic encapsulation layer 23 to enhance moisture-oxygen barrier effect.

In an exemplary embodiment, the first bank 30 includes a first sub-bank 31 and a second sub-bank 32 sequentially superposed in a direction from the insulating layer 12 towards the first inorganic encapsulation layer 21, the first sub-bank 31 is disposed on a same layer as the pixel definition layer 141 of the display area, and the first sub-bank 31 and the pixel definition layer 141 of the display area are formed by a one-time patterning process. The second bank 40 includes a third sub-bank 41, a fourth sub-bank 42, and a fifth sub-bank 43 sequentially superposed in a direction from the insulating layer 12 towards the first inorganic encapsulation layer 21. The third sub-bank 41 is disposed on a same layer as the first structure layer 131, that is, the third sub-bank 41 and the first structure layer 131 are formed by a one-time patterning process, the fourth sub-bank 42 is disposed on a same layer as the pixel definition layer 141 of the display area, that is, the fourth sub-bank 42 and the pixel definition layer 141 of the display area are formed by a one-time patterning process, and the fifth sub-bank 43 is disposed on a same layer as the second sub-bank 32.

As shown in FIG. 3, in an exemplary embodiment, a hollow structure 121 is disposed at a location of the insulating layer 12 close to an outer edge of the display panel, and an anti-crack dam 134 which covers the hollow structure 121 is disposed at a location of the hollow structure 121. The anti-crack dam 134 is disposed on a same layer as the first structure layer 131. The anti-crack dam 134 may prevent the display panel from cracking.

The technical solution of the present disclosure will be exemplarily explained by a preparation process of the display panel as shown in FIG. 3 below. Those skilled in the art may understand that for "patterning" said in the present disclosure, when a patterned material is an inorganic material or metal, the "patterning" may include processes such as photoresist coating, mask exposure, development, etching, photoresist stripping, etc., when the patterned material is an organic material, the "patterning" may include processes such as mask exposure, development, etc., and evaporation, deposition, coating, coating, etc., said in the present disclosure are all mature preparation processes in the related art.

The preparation process of the display panel includes acts S1-5.

Act S1: a base structure layer is formed.

Act S2: an insulating layer located in a transition area is formed on the base structure layer.

Act S3: a construction structure and a first inorganic encapsulation layer located on the insulating layer are sequentially formed in the transition area, wherein the first inorganic encapsulation layer has a concave-convex structure.

Act S4: an organic encapsulation layer located on the first inorganic encapsulation layer is formed by using an ink jet printing process.

Figure 4A:
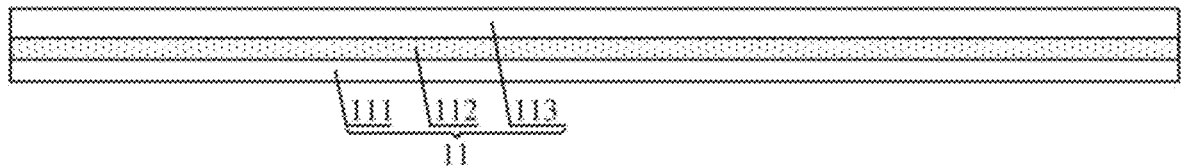
FIG. 4a is a schematic diagram of a structure in a display panel after a base structure layer is formed.

Act S1: the base structure layer 11 is formed. This act may include the following content: a first flexible substrate 111, a buffer layer 112 and a second flexible substrate 113 are sequentially formed on a hard substrate, as shown in FIG. 4a. FIG. 4a is a schematic diagram of a structure in a display panel after a base structure layer is formed. Materials of the first flexible substrate 111 and the second flexible substrate 113 may be same, and materials such as polyimide (PI), polyethylene terephthalate (PET) or a surface-treated polymer soft film may be used in the flexible substrate. Silicon nitride (SiNx), silicon oxide (SiOx) or the like may be used in the buffer layer 112 which may be a single layer or may be a multi-layer structure of silicon nitride/silicon oxide.

Figure 4B:
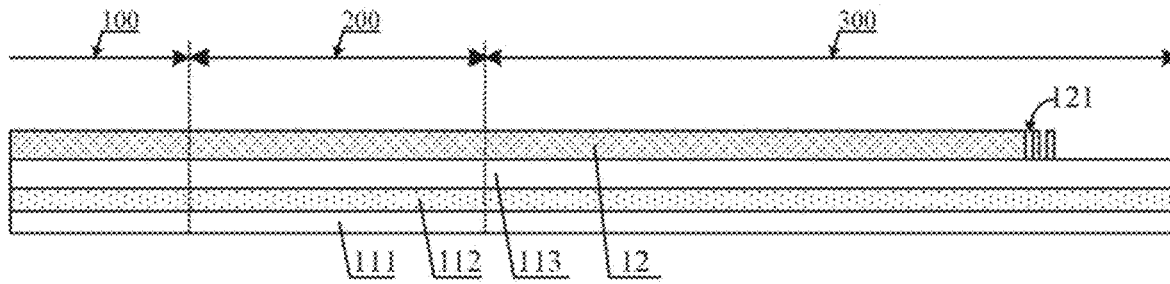
FIG. 4b is a schematic diagram of a structure in a display panel after an insulating layer is formed.

Act S2: a driving structure layer located in the display area and an insulating layer 12 located in the transition area are formed. This act may include the following content: a driving structure layer is formed on the base structure layer 11, wherein the driving structure layer includes a thin film transistor located in the display area. In the process of forming the driving structure layer, the insulating layer 12 located in a frame area (i.e., the transition area and an outer edge area) is formed, as shown in FIG. 4b. FIG. 4b is a schematic diagram of a structure in the display panel after an insulating layer is formed. In an exemplary embodiment, as shown in FIG. 4b, a hollow structure 121 is disposed at a location of the insulating layer 12 close to an outer edge of the display panel, and the base structure layer 11 is exposed through the hollow structure 121. The insulating layer 12 may include a gate insulating layer, an interlayer insulating layer, or the like in a process of forming a thin film transistor. For example, taking a top gate type thin film transistor as an example, an active layer located in the display area is formed on the base structure layer 11, a gate insulating layer is formed on the active layer, a gate electrode is formed on the gate insulating layer, an interlayer insulating layer is formed on the gate electrode, a source electrode and a drain electrode are formed on the interlayer insulating layer, and the source electrode and the drain electrode are electrically connected with the gate electrode through vias passing through the interlayer insulating layer and the gate insulating layer respectively. Then, the insulating layer 12 may include the gate insulating layer and the interlayer insulating layer. The hollow structure 121 is simultaneously formed in a process of forming vias used for connecting the source/drain electrode and the active layer. The insulating layer 12 may be an inorganic insulating layer, and a material of the insulating layer 12 may include at least one of Silicon Nitride (SiNx), Silicon Oxide (SiOx), and the like.

Act S3 may include acts S311-314.

Act S311: a first structure layer 131 on the insulating layer is formed in the transition area. This act may include the following content: a planarization film is formed on the insulating layer 12, patterning processing is performed on the planarization film, a planarization layer 13 is formed in the display area, the first structure layer 131 is formed in the transition area, multiple grooves 132 sequentially disposed in parallel in a direction from the display area towards the outer edge area are formed on a side surface of the first structure layer 131 facing the first inorganic encapsulation layer, a third sub-bank 41 is formed at a location of a second bank, an anti-crack dam 134 which covers a hollow structure 121 is formed at a location of the hollow structure 121, and the planarization film at others location is removed. The above content may be understood with reference to FIG. 4c.

Figure 4C:
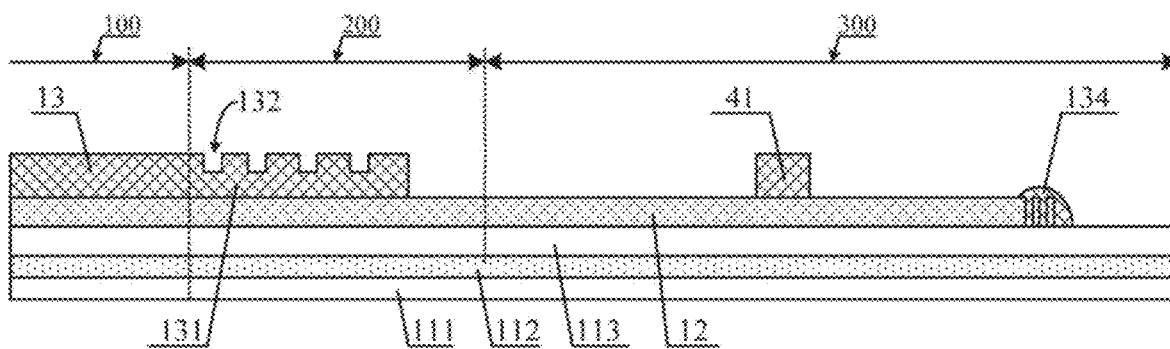
FIG. 4c is a schematic diagram of a structure in a display panel after a first structure layer is formed.

FIG. 4c is a schematic diagram of a structure in the display panel after a first structure layer is formed. In an exemplary embodiment, a material of the planarization film may include an organic material, and the planarization film is formed by using a coating process. The planarization film may be exposed and developed by using a halftone mask to complete the patterning process of the planarization film. In an exemplary embodiment, multiple grooves 132 are disposed in parallel at equal intervals, and a depth of the groove 132 is smaller than a thickness of the planarization film. Grooves 132 are formed on the planarization film, then protrusions are formed between two adjacent grooves 132, so that a side of the first structure layer away from the base structure layer has a concave-convex structure, as shown in FIG. 4c. It is easy to understand that when the halftone mask is used for exposure, the transmittance at different locations is different, thus effectiveness losing of photoresists with different thicknesses is realized. After development, patterns with different heights may be obtained, for example, a height of the third sub-bank 41 in FIG. 4c is different from the depth of the groove 132.

Figure 4D:
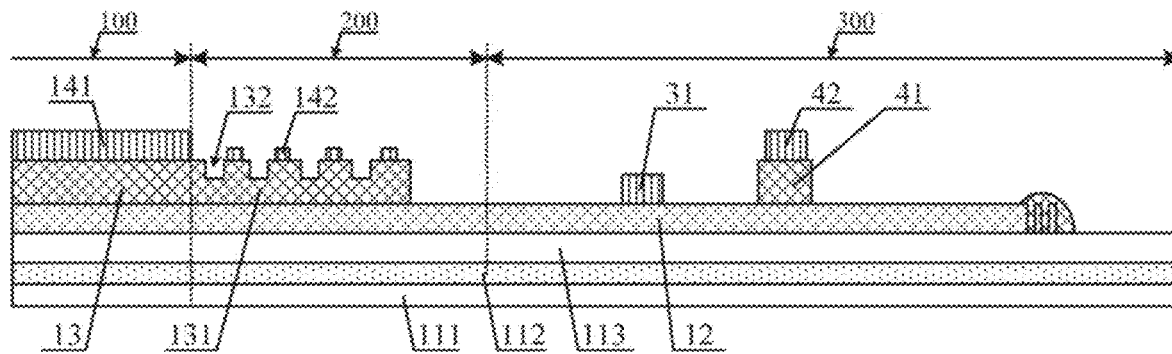
FIG. 4d is a schematic diagram of a structure in a display panel after a columnar body is formed.

S312: a second structure layer is formed. This act may include the following content: a pixel definition film is formed on the base structure layer 11 formed with the planarization layer 13 and the first structure layer 131, patterning processing is performed on the pixel definition film, a pixel definition layer 141 having pixel apertures is formed in the display area, a second structure layer superposed on the first structure layer 131 is formed in the transition area, the second structure layer includes a columnar body 142, the columnar body 142 is located between two adjacent grooves 132, a first sub-bank 31 located on the insulating layer 12 is formed at a location of the first bank, a fourth sub-bank 42 located on a third sub-bank 41 is formed at a location of the second bank, and the pixel definition film at other locations is removed. The above content may be understood with reference to FIG. 4d. FIG. 4d is a schematic diagram of a structure in a display panel after a columnar body is formed. Herein, an organic material, such as polyimide, acrylic or polyethylene terephthalate, may be used in the pixel definition film. In an exemplary embodiment, patterning processing may be performed on the pixel definition film by using a halftone mask, and a thickness of the formed columnar body 142 may be smaller than a thickness of the pixel definition layer 141.

In an exemplary embodiment, in a process of forming the columnar body 142, in order to avoid an influence of the exposure and development process on the groove 132, when materials of the pixel definition film and the planarization film are both organic materials, illumination properties of the materials of the pixel definition film and the planarization film are opposite. In other words, when a positive organic material (an organic material having a same illumination property as a positive photoresist), such as a positive photoresist, is used in the planarization film, a negative organic material (an organic material having a same illumination property as a negative photoresist), such as a negative photoresist, is used in the pixel definition film. When a negative organic material is used in the planarization film, a positive organic material is used in the pixel definition film.

The arrangement of the columnar body 142 may increase a height difference between a concave part and a convex part of the transition area, and further may make the concave-convex structure of the first inorganic encapsulation layer bumpier when the first inorganic encapsulation layer is subsequently formed. In an exemplary embodiment, an orthographic projection of the columnar body 142 on the base structure layer 11 is smaller than a distance between two grooves 132 adjacent to the columnar body 142, so that a stepped transition is presented between concave and convex surfaces, and thus, when the first inorganic encapsulation layer 21 is subsequently formed, a concave part and a convex part of the obtained concave-convex structure are connected through a stepped connecting wall.

Figure 4E:
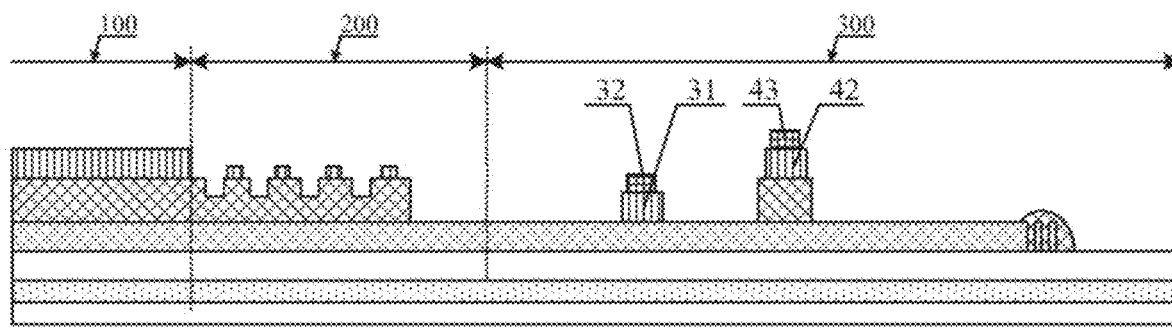
FIG. 4e is a schematic diagram of a structure in a display panel after a second sub-bank and a fifth sub-bank are formed.

Act S313: a second sub-bank 32 located on the first sub-bank 31 and a fifth sub-bank 43 on the fourth sub-bank 42 are formed, as shown in FIG. 4e. FIG. 4e is a schematic structural diagram of a structure in a display panel after a second sub-bank and a fifth sub-bank are formed. The second sub-bank and the fifth sub-bank may be formed using a method in the prior art, which will not be described here. Materials of the second sub-bank and the fifth sub-bank may be organic materials or inorganic materials.

Figure 4F:
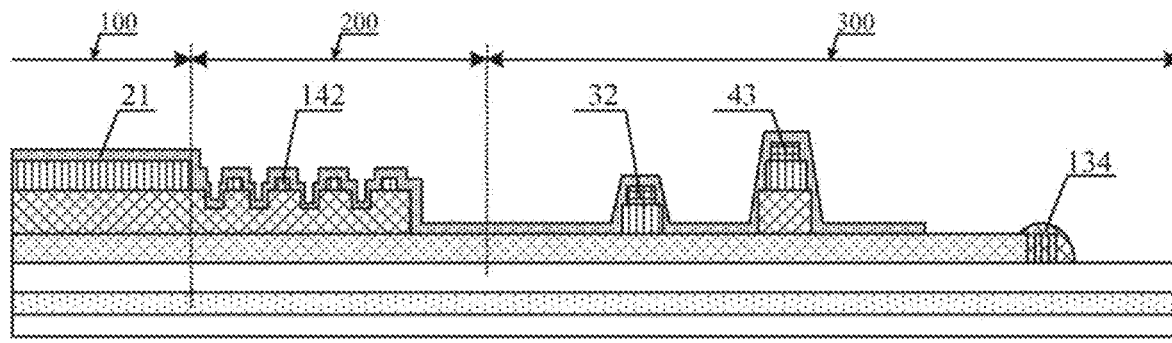
FIG. 4f is a schematic diagram of a structure in a display panel after a first inorganic encapsulation layer is formed.

Act S314: a first inorganic encapsulation layer 21 is formed. This act may include the following content: the first inorganic encapsulation layer 21 is formed on a base structure layer formed with the second sub-bank and the fifth sub-bank, and a metal mask plate may be used as a mask to deposit and form the first inorganic encapsulation layer 21. The above content may be understood with reference to FIG. 4f. FIG. 4f is a schematic diagram of a structure in a display panel after a first inorganic encapsulation layer is formed. The arrangement of the groove 132 and the columnar body 142 makes the first inorganic encapsulation layer 21 have a concave-convex structure in the transition area, as shown in FIG. 4f, and a concave part and a convex part of the first inorganic encapsulation layer 21 are connected through a stepped connecting wall in the transition area. The first inorganic encapsulation layer 21 covers from the display area to the second bank, and does not cover the anti-crack dam 134 and an area close to an edge part of the display panel. The above content may be understood with reference to FIG. 4f.

Those skilled in the art may understand that before the first inorganic encapsulation layer 21 is formed, an organic functional layer and a cathode are also to be formed on the pixel definition layer. In the frame area, the organic functional layer and the cathode will not affect the structure of the first inorganic encapsulation layer, so formation acts of the organic functional layer and the cathode are omitted here.

Figure 4G:
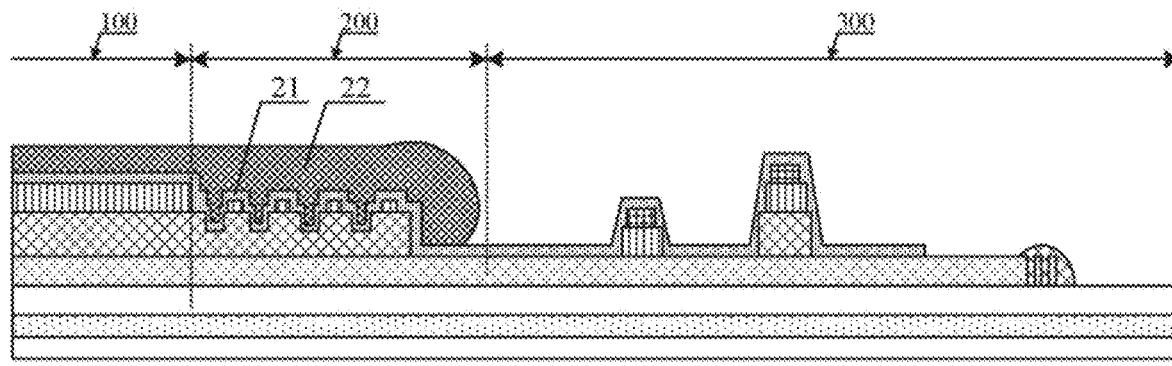
FIG. 4g is a schematic diagram of a structure in a display panel after an organic encapsulation layer is formed.

Act S4: an organic encapsulation layer 22 located on the first inorganic encapsulation layer 21 is formed by using an ink jet printing method. This act may include the following content: a liquid organic encapsulation material is formed on the first inorganic encapsulation layer 21 by using an ink jet printing method, and an organic encapsulation layer 22 is formed after the liquid organic encapsulation material is cured, as shown in FIG. 4g. FIG. 4g is a schematic diagram of a structure in the display panel after an organic encapsulation layer is formed. It is easy to understand that when the organic encapsulation material is ink jet printed, it is required to ensure planarization of the organic encapsulation material in the display area to ensure planarization of the organic encapsulation layer in the display area. A range of ink jet printing may be determined according to a specific situation, and those skilled in the art may understand that the organic encapsulation material in the transition area is the liquid organic encapsulation material flowing out from the display area.

Before the organic encapsulation layer 22 is cured, the organic encapsulation material is in a liquid state. The first inorganic encapsulation layer 21 has the concave-convex structure in the transition area, the concave part may accommodate the excess part of the liquid organic encapsulation material, and the convex part may effectively block climbing of the liquid organic encapsulation material and slow down flow of the liquid organic encapsulation material. This effectively prevents the liquid organic encapsulation material from overflowing from the transition area to the outer edge area, ensures encapsulation reliability of the organic encapsulation layer, and improves encapsulation effect.

In addition, the first inorganic encapsulation layer has the concave-convex structure in the transition area, and this prolongs an encapsulation path of the first inorganic encapsulation layer, improves moisture-oxygen barrier properties of the first inorganic encapsulation layer, avoids a defect of growing dark spots (GDS) caused by failed encapsulation, improves properties of the display panel, and prolongs service life of the display panel.

The preparation method of the display panel may further include: act S5.

Act S5: a second inorganic encapsulation layer 23 is formed on the organic encapsulation layer 22, as shown in FIG. 3. A metal mask plate may be used as a mask to deposit and form a second inorganic encapsulation layer 23, and the second inorganic encapsulation layer 23 covers the first inorganic encapsulation layer 21.

In another embodiment, the columnar body 142 may be made of a same material as the first structure layer 131, and the columnar body 142 may be formed with the first structure layer 131 by a one-time patterning process. In an exemplary embodiment, S3 may include acts S321-321.

Figure 5A:
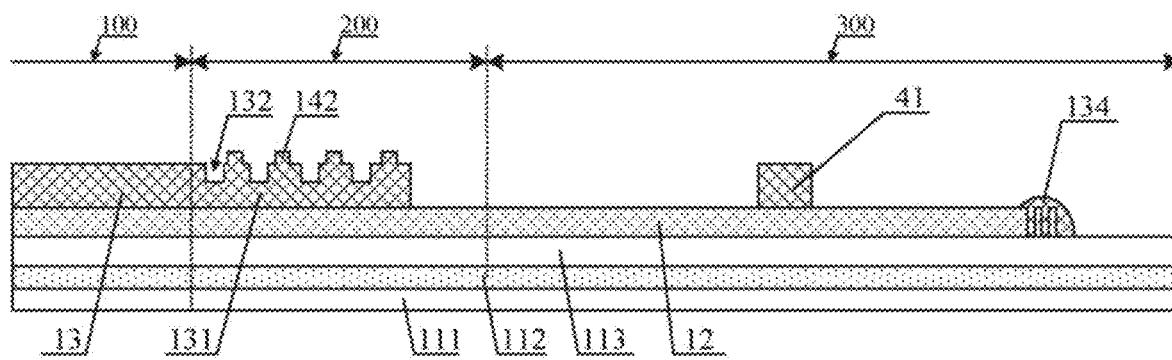
FIG. 5a is a schematic diagram of a structure in a display panel after a first structure layer and a columnar body are formed according to another embodiment.

Act S321: a first structure layer 131 and a second structure layer are formed. This act may include the following content: a planarization film is formed on the insulating layer 12, patterning processing is performed on the planarization film by using a halftone mask, part of the planarization film located in the display area is removed to form a planarization layer 13, part of the planarization film located in the transition area is removed to form the first structure layer 131 and the second structure layer located on a side of the first structure layer away from the insulating layer, the first structure layer 131 is provided with multiple grooves 132 on a side facing the first inorganic encapsulation layer, the second structure layer includes a columnar body 142, and the columnar body 142 is located between two adjacent grooves 132; a third sub-bank 41 is formed by removing part of the planarization film at a location of the second bank, an anti-crack dam 134 is formed by removing part of the planarization film at a location of the hollow structure 121, and the planarization film at others location is removed. The above content may be understood with reference to FIG. 5a. FIG. 5a is a schematic diagram of a structure in a display panel after a first structure layer and a columnar body are formed according to another embodiment. In an exemplary embodiment, a side surface of the columnar body 142 away from the insulating layer 12 is remote from the insulating layer 12 with respect to a side surface of the planarization layer 13 away from the insulating layer 12, that is, an upper surface of the columnar body 142 is higher than an upper surface of the planarization layer 13.

Figure 5B:
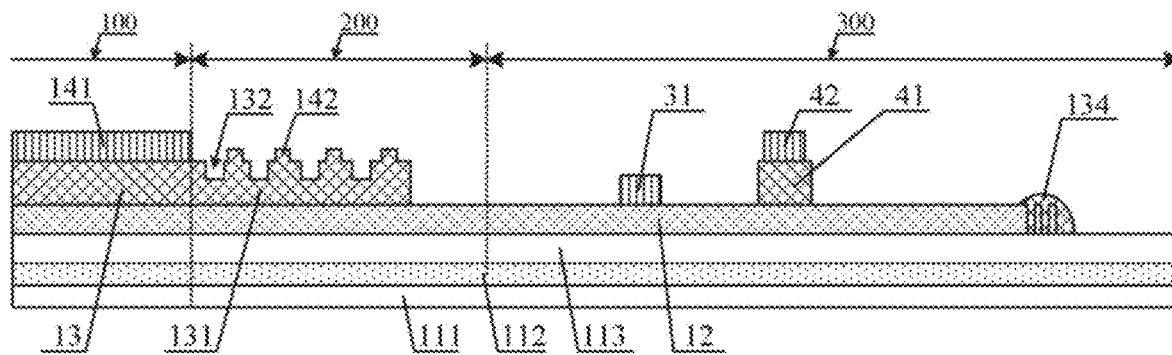
FIG. 5b is a schematic diagram of a structure in a display panel after a pixel definition layer is formed according to another embodiment.

Act S322: a pixel definition layer located in the display area is formed. This act may include the following content: a pixel definition film is formed on the base structure layer formed with the planarization layer 13 and the second structure layer; patterning processing is performed on the pixel definition film, a pixel definition layer 141 having pixel apertures is formed in the display area, a first sub-bank 31 located on the insulating layer 12 is formed at a location of the first bank, a fourth sub-bank 42 located on a third sub-bank 41 is formed at a location of the second bank, and the pixel definition film at other locations is removed. The above content may be understood with reference to FIG. 5b. FIG. 5b is a schematic diagram of a structure in a display panel after a pixel definition layer is formed according to another embodiment.

In an exemplary embodiment, in order to avoid an influence of the exposure and development process on the groove 132 and the columnar body 142, when materials of the pixel definition film and the planarization film are both organic materials, illumination properties of the materials of the pixel definition film and the planarization film are opposite. In other words, when a positive organic material (an organic material having a same illumination property as a positive photoresist), such as a positive photoresist, is used in the planarization film, a negative organic material (an organic material having a same illumination property as a negative photoresist), such as a negative photoresist, is used in the pixel definition film. When a negative organic material is used in the planarization film, a positive organic material is used in the pixel definition film.

In an exemplary embodiment, materials of the second structure layer, the first structure layer 131 and the pixel definition layer of the display area are same, and the second structure layer, the first structure layer 131 and the pixel definition layer of the display area are formed by a one-time patterning process. In an exemplary embodiment, S3 may include acts S331-331.

Figure 6:
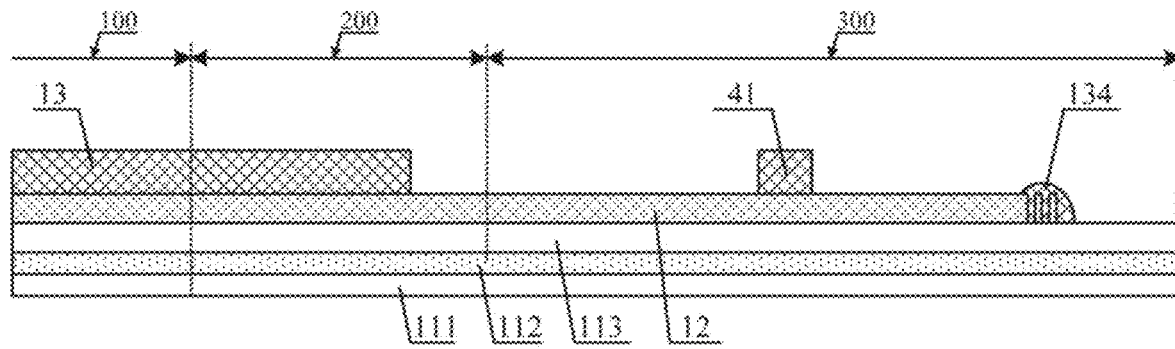
FIG. 6 is a schematic structural diagram of a display panel after a planarization layer is formed according to another embodiment.

Act S331: a planarization film located on the insulating layer is formed in the transition area. This act may include the following content: the planarization film is formed on the insulating layer 12, patterning processing is performed on the planarization film, the planarization film in the display area is reserved to form a planarization layer, the planarization film at a location of the construction structure is reserved, the planarization film is reserved at a location of a second bank and at a location of a hollow structure 121 to form a third sub-bank 41 and an anti-crack dam 134 respectively, and the planarization film at other locations is removed, thus the planarization film is formed in the transition area. The above content may be understood with reference to FIG. 6. FIG. 6 is a schematic structural diagram of a display panel after a planarization layer is formed according to another embodiment.

Act S332: a pixel definition layer, a columnar body, and a first structure layer are formed. This act may include the following content: a pixel definition film is formed on the base structure layer formed with the planarization layer 13, thereby a pixel definition film located on the planarization film is formed in the transition area, patterning processing are performed on the pixel definition film and the planarization film by using a halftone mask, a pixel definition layer 141 having pixel apertures is formed in the display area, part of the pixel definition film and part of the planarization film are removed in the transition area to form a first structure layer 131 and a second structure layer on a side of the first structure layer 131 away from the insulating layer 12, the first structure layer 131 is provided with multiple grooves 132 on a side facing the first inorganic encapsulation layer 21, the second structure layer includes a columnar body 142, and the columnar body 142 is located between two adjacent grooves 132; the pixel definition film is reserved at a location of the first bank to form a first sub-bank 31 on the insulating layer 12, the pixel definition film is reserved at a location of a second bank to form a fourth sub-bank 42 on a third sub-bank 41, and the pixel definition film at other locations is removed. The above content may be understood with reference to FIG. 4d. In an exemplary embodiment, the planarization film and the pixel definition film are organic materials of the same material.

Figure 7:
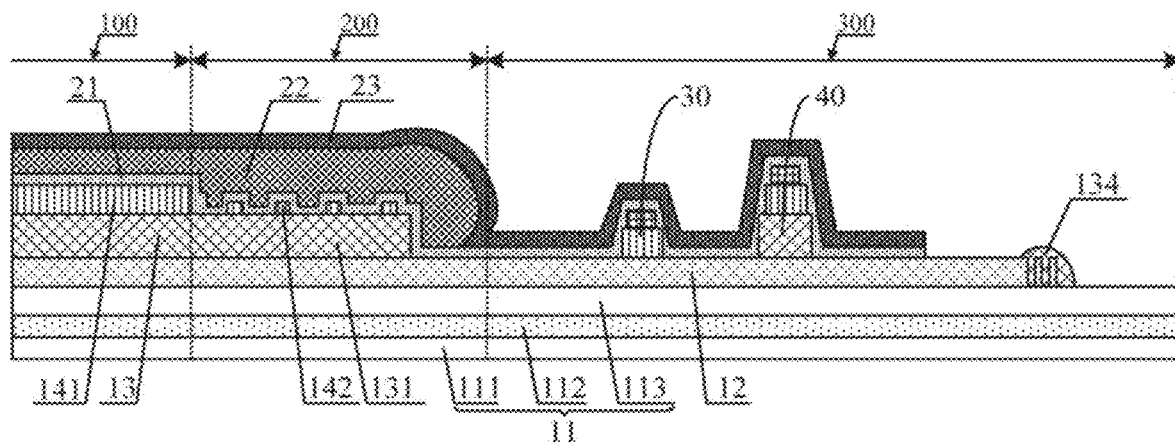
FIG. 7 is a cross-sectional view of a display panel according to another embodiment.

FIG. 7 is a cross-sectional view of a display panel according to another embodiment. As shown in FIG. 7, in an exemplary embodiment, the construction structure includes a first structure layer 131 disposed on the insulating layer 12 and a second structure layer disposed on a side of the first structure layer 131 away from the insulating layer 12. A side of the first structure layer 131 facing the first inorganic encapsulation layer 21 has a planarized surface. The second structure layer includes a columnar body 142, the columnar body 142 is one of multiple columnar bodies, and the multiple columnar bodies 142 are sequentially disposed in parallel in a direction from the display area toward the outer edge area, thereby making a subsequently formed first inorganic encapsulation layer 21 have a concave-convex structure in the transition area.

In an exemplary embodiment, act S3 may include:

Act S341: a first structure layer 131 on the insulating layer is formed in the transition area. This act may include the following content: a planarization film is formed on the insulating layer 12, patterning processing is performed on the planarization film, the planarization film in the display area is reserved to form a planarization layer 13, the planarization film at a location of the construction structure is reserved to form the first structure layer 131, a side of the first structure layer 131 facing the first inorganic encapsulation layer 21 has a planarized surface, the planarization film is reserved at a location of a second bank and a location of a hollow structure 121 to form a third sub-bank 41 and an anti-crack dam 134 respectively, and the planarization film at others location is removed. The above content may be understood with reference to FIG. 6.

Figure 8:
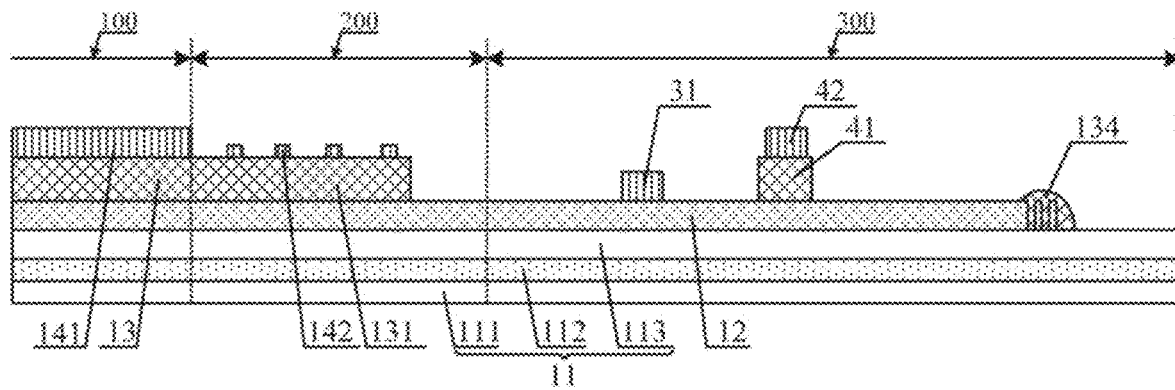
FIG. 8 is a schematic diagram of a structure in a display panel after a columnar body is formed according to another embodiment.

Act S342: a pixel definition layer and a columnar body are formed. This act may include the following content: a pixel definition film is formed on the base structure layer formed with the planarization layer 13 and the first structure layer 131, patterning processing is performed on the pixel definition film by using a halftone mask, a pixel definition layer 141 having pixel apertures is formed in the display area, part of the pixel definition film is removed in the transition area to form a second structure layer superposed on the first structure layer 131, the second structure layer includes a columnar body 142, the columnar body 142 is one of multiple columnar bodies, the multiple columnar bodies 142 are sequentially disposed at intervals, the pixel definition film is reserved at a location of a first bank to form a first sub-bank 31 on the insulating layer 12, the pixel definition film is reserved at a location of a second bank to form a fourth sub-bank 42 on a third sub-bank 41, and the pixel definition film at other locations is removed. The above content may be understood with reference to FIG. 8. FIG. 8 is a schematic diagram of a structure in a display panel after a columnar body is formed according to another embodiment.

In the present embodiment, in a process of forming the columnar body 142, in order to avoid an influence of the exposure and development process on the planarized surface of the first structure layer, when materials of the pixel definition film and the planarization film are both organic materials, illumination properties of the materials of the pixel definition film and the planarization film are opposite. In other words, when a positive organic material (an organic material having a same illumination property as a positive photoresist), such as a positive photoresist, is used in the planarization film, a negative organic material (an organic material having a same illumination property as a negative photoresist), such as a negative photoresist, is used in the pixel definition film. When a negative organic material is used in the planarization film, a positive organic material is used in the pixel definition film.

Figure 9:
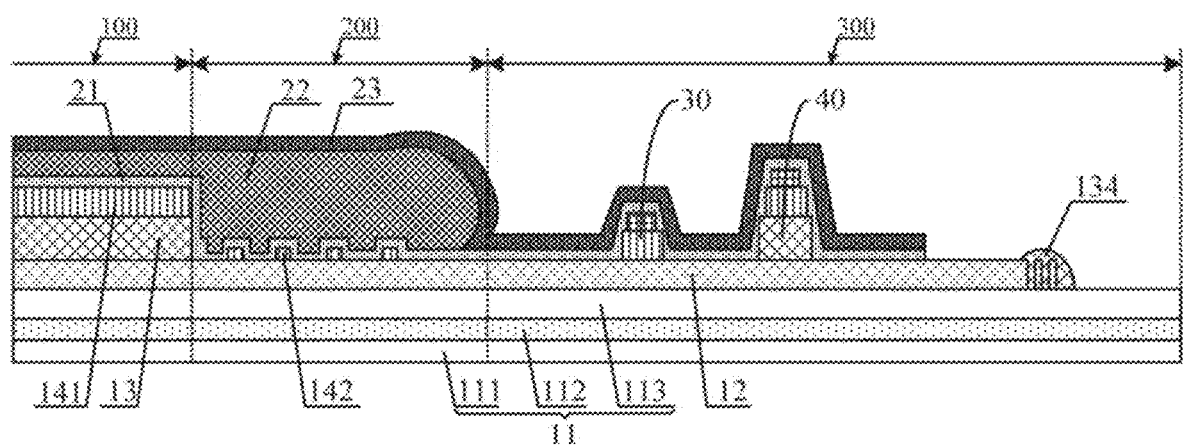
FIG. 9 is a cross-sectional view of a display panel according to another embodiment.

FIG. 9 is a cross-sectional view of a display panel according to another embodiment. In an exemplary embodiment, as shown in FIG. 9, the construction structure includes a second structure layer disposed on an insulating layer 12, wherein the second structure layer includes multiple columnar bodies 142 which are sequentially disposed in parallel in a direction from a display area 100 toward the outer edge area 300, so that the first inorganic encapsulation layer 21 has a concave-convex structure. The display area of the display panel is of a structure including a base structure layer, a driving structure layer disposed on the base structure layer, a planarization layer 13 disposed on the driving structure layer, and a pixel definition layer disposed on the planarization layer. The second structure layer and the pixel definition layer are formed through a one-time patterning process. In an exemplary embodiment, S3 may include acts S351-352.

Act S351: a planarization film is formed on the insulating layer 12, patterning processing is performed on the planarization film, the planarization film in the display area is reserved to form a planarization layer 13, the planarization film is reserved at a location of a second bank and a location of a hollow structure 121 to form a third sub-bank 41 and an anti-crack dam 134 respectively, and the planarization film is removed in the transition area and at other locations. The above content may be understood with reference to FIG. 9.

Act S352: a pixel definition layer and a second structure layer are formed. This act may include the following content: a pixel definition film is formed on the base structure layer formed with a planarization layer 13, patterning processing is performed on the pixel definition film by using a halftone mask, a pixel definition layer 141 having pixel apertures is formed in the display area, part of the pixel definition film is removed in the transition area to form a second structure layer located on the insulating layer 12, the second structure layer includes a columnar body 142, the columnar body 142 may be a single columnar body or one of multiple columnar bodies, the multiple columnar bodies 142 are sequentially disposed in parallel in a direction from the display area 100 towards the outer edge area 300, the pixel definition film is reserved at a location of a first bank to form a first sub-bank 31 on the insulating layer 12, the pixel definition film is reserved at a location of a second bank to form a fourth sub-bank 42 on a third sub-bank 41, and the pixel definition film at other locations is removed. The above content may be understood with reference to FIG. 9.

The present disclosure also proposes a preparation method of a display panel, wherein the display panel includes a display area and a frame area located at a side of the display area, and the frame area includes a transition area close to the display area and an outer edge area remote from the display area. The method includes acts S1-4.

Act S1: a base structure layer is formed.

Act S2: an insulating layer located in the transition area is formed on the base structure layer.

Act S3: a construction structure and a first inorganic encapsulation layer located on the insulating layer are sequentially formed in the transition area, wherein the first inorganic encapsulation layer has a concave-convex structure.

Act S4: an organic encapsulation layer located on the first inorganic encapsulation layer is formed by using an ink jet printing process.

In an exemplary embodiment, act S3 may include: forming a planarization film on the insulating layer, performing patterning processing on the planarization film, and forming a planarization layer located in the display area and a first structure layer located in the transition area, wherein the first structure layer is provided with a groove on a side facing the first inorganic encapsulation layer; and forming the first inorganic encapsulation layer on the first structure layer, the first inorganic encapsulation layer having a concave-convex structure in the transition area.

Optionally, forming the first inorganic encapsulation layer on the first structure layer, the first inorganic encapsulation layer having the concave-convex structure in the transition area, includes: forming a pixel definition film on the planarization layer and the first structure layer, performing patterning processing on the pixel definition film, forming a pixel definition layer in the display area, and forming a second structure layer superposed on the first structure layer in the transition area, wherein the second structure layer includes a columnar body, and the columnar body is located between two adjacent grooves; and forming the first inorganic encapsulation layer on the pixel definition layer and the second structure layer, wherein the first inorganic encapsulation layer has a concave-convex structure in the transition area.

In an exemplary embodiment, act S3 may include: forming a planarization film on the insulating layer, performing patterning processing on the planarization film by using a halftone mask, removing part of the planarization film located in the display area to form a planarization layer, and removing part of the planarization film located in the transition area to form a first structure layer and a second structure layer located on a side of the first structure layer away from the insulating layer, wherein the first structure layer is provided with multiple grooves on a side facing the first inorganic encapsulation layer, the second structure layer includes a columnar body, and the columnar body is located between two adjacent grooves; forming a pixel definition film on the planarization layer and the second structure layer, performing patterning processing on the pixel definition film, forming a pixel definition layer located in the display area, and removing the pixel definition film in the transition area; and forming a first inorganic encapsulation layer on the pixel definition layer, wherein the first inorganic encapsulation layer has a concave-convex structure in the transition area.

In an exemplary embodiment, act S3 may include: sequentially forming a planarization film and a pixel definition film located on the insulating layer in the transition area; performing patterning processing on the pixel definition film and the planarization film by using a halftone mask, and removing part of the pixel definition film and part of the planarization film in the transition area to form a first structure layer and a second structure layer located on a side of the first structure layer away from the insulating layer, wherein the first structure layer is provided with multiple grooves on a side facing the first inorganic encapsulation layer, the second structure layer includes a columnar body, and the columnar body is located between two adjacent grooves; and forming the first inorganic encapsulation layer on the second structure layer, wherein the first inorganic encapsulation layer has a concave-convex structure in the transition area.

In an exemplary embodiment, act S3 may include: forming a planarization film on the insulating layer, performing patterning processing on the planarization film, reserving the planarization film in the display area to form a planarization layer, reserving the planarization film at a location of the construction structure to form a first structure layer, wherein a side of the first structure layer facing the first inorganic encapsulation layer has a planarized surface; and forming a pixel definition film on the planarization layer and the first structure layer, performing patterning processing on the pixel definition film, forming a pixel definition layer in the display area, and forming a second structure layer superposed on the first structure layer in the transition area, wherein the second structure layer includes a columnar body, and the first inorganic encapsulation layer has a concave-convex structure.

In an exemplary embodiment, act S3 may include: forming a planarization film on the insulating layer, performing patterning processing on the planarization film, forming a planarization layer located in the display area, and removing a planarization film in the transition area; and forming a pixel definition film on the planarization layer, performing patterning processing on the pixel definition film, forming a pixel definition layer in the display area, and forming a second structure layer located on the insulating layer in the transition area, wherein the second structure layer includes a columnar body, and the first inorganic encapsulation layer has a concave-convex structure.

The detailed preparation process of the display panel has been described above and will not be described here.

The present disclosure also provides a display apparatus, including a display panel using the aforementioned embodiment. The display apparatus may be any product or component with a display function such as a mobile phone, a tablet computer, a television, a display, a notebook computer, a digital photo frame, a navigator, etc.

In the description of the embodiments of the present disclosure, it need be understood that, an azimuth or locational relationship indicated by terms "a middle part", "upper", "lower", "front", "rear", "vertical", "horizontal", "top", "bottom", "inner", "outside", or the like is based on the azimuth or positional relationship shown in the drawings, which is only for ease of description of the present disclosure and simplification of the description, rather than indicating or implying that the apparatus or element referred to must have a specific orientation, or be constructed and operated in a particular orientation, and therefore cannot be understood as limiting the present disclosure.

In the description of the embodiments of the present disclosure, it need be noted that terms "installed", "connected" and "connected" shall be broadly understood unless otherwise explicitly specified and defined, for example, it may be a fixedly connected, or removable connected, or integrally connected; it may be mechanically connected or electrically connected; it may be directly connected, or indirectly connected through an intermediate medium, or it may be communication inside two elements. For those of ordinary skilled in the art, they may understand specific meanings of the above terms in the present disclosure by a specific situation.

Although embodiments of the present disclosure are described in the above, the above contents are only embodiments for ease of understanding the present disclosure, but not intended to restrict the present disclosure. Any person skilled in the art to which the present disclosure pertains may make any modifications or variations in the form or details of implementation without departing from the spirit and the scope of the present disclosure, but the patent protection scope of the present disclosure shall still be subject to the scope defined in the appended claims.

What is claimed is:

1. A display panel, comprising a display area and a frame area located at a side of the display area, wherein
    the frame area comprises a transition area close to the display area and an outer edge area remote from the display area,
    the transition area of the display panel is of a structure comprising a base structure layer, an insulating layer disposed on the base structure layer, a construction structure disposed on the insulating layer, and a first inorganic encapsulation layer and an organic encapsulation layer sequentially disposed on the construction structure, and
    the first inorganic encapsulation layer has a concave-convex structure in the transition area; wherein
    the outer edge area comprises a hollow structure disposed at a location of the insulating layer close to an outer edge of the display panel, and an anti-crack dam which covers the hollow structure and is disposed at a location of the hollow structure; wherein the hollow structure comprises multiple columns sequentially disposed at intervals;
    the construction structure of the transition area comprises multiple columnar bodies which are sequentially disposed at intervals, and the first inorganic encapsulation layer covers the multiple columnar bodies to form the concave-convex structure in the transition area; the outer edge area comprises multiple banks which are sequentially disposed at intervals; the multiple columnar bodies and the multiple banks are arranged on a same layer;
    the multiple banks comprises a first bank which is disposed on the insulating layer and closest to the organic encapsulation layer;
    the display panel further comprises a second inorganic encapsulation layer, a horizontal straight line segment of the second inorganic encapsulation layer is located between the organic encapsulation layer and the first bank, closest to the organic encapsulation layer, of the multiple banks, the horizontal straight line segment is located at a side of all banks of the multiple banks, and a height of the horizontal straight line segment is less than all heights of all banks of the multiple banks, and the horizontal straight line segment separates the organic encapsulation layer from the first inorganic encapsulation layer covering all of the banks of the multiple banks.

2. The display panel according to claim 1, wherein
    the construction structure comprises a first structure layer disposed on the insulating layer,
    the first structure layer is provided with a groove on a side facing the first inorganic encapsulation layer, and
    the first inorganic encapsulation layer has a concave-convex structure.

3. The display panel according to claim 2, wherein the groove is one of multiple grooves, and the multiple grooves are sequentially disposed in parallel in a direction from the display area towards the outer edge area.

4. The display panel according to claim 3, wherein
    the construction structure further comprises a second structure layer superposed on a side of the first structure layer away from the insulating layer,
    the second structure layer comprises a columnar body, and the columnar body is disposed between two adjacent grooves.

5. The display panel according to claim 4, wherein the columnar body has a width smaller than a distance between two grooves adjacent to the columnar body, a concave part and a convex part of the concave-convex structure are connected through a stepped connecting wall, and the width is a size of the columnar body in a direction along which the multiple grooves are arranged.

6. The display panel according to claim 3, wherein
the display area of the display panel is of a structure comprising a base structure layer, a driving structure layer disposed on the base structure layer, a planarization layer disposed on the driving structure layer, and a pixel definition layer disposed on the planarization layer,
the first structure layer is disposed on a same layer as the planarization layer, and
the columnar body is disposed on a same layer as the pixel definition layer.

7. The display panel according to claim 1, wherein the construction structure comprises a first structure layer disposed on the insulating layer and a second structure layer disposed on a side of the first structure layer away from the insulating layer, a side of the first structure layer facing the first inorganic encapsulation layer has a planarized surface, the second structure layer comprises a columnar body, and the first inorganic encapsulation layer has a concave-convex structure.

8. The display panel according to claim 7, wherein
the display area of the display panel is of a structure comprising a base structure layer, a driving structure layer disposed on the base structure layer, a planarization layer disposed on the driving structure layer, and a pixel definition layer disposed on the planarization layer,
the first structure layer is disposed on a same layer as the planarization layer, and
the columnar body is disposed on a same layer as the pixel definition layer.

9. The display panel according to claim 1, wherein
the construction structure comprises a second structure layer disposed on the insulating layer,
the second structure layer comprises the multiple columnar bodies,
the display area of the display panel is of a structure comprising a base structure layer, a driving structure layer disposed on the base structure layer, a planarization layer disposed on the driving structure layer, and a pixel definition layer disposed on the planarization layer, and
the second structure layer is disposed on a same layer as the pixel definition layer.

10. A preparation method of a display panel, the display panel comprising a display area and a frame area located at a side of the display area, the frame area comprising a transition area close to the display area and an outer edge area remote from the display area, and the method comprising:
forming a base structure layer;
forming an insulating layer located in the transition area on the base structure layer;
sequentially forming a construction structure and a first inorganic encapsulation layer located on the insulating layer in the transition area, the first inorganic encapsulation layer having a concave-convex structure; and
forming an organic encapsulation layer located on the first inorganic encapsulation layer by using an ink jet printing process; wherein
the outer edge area comprises a hollow structure disposed at a location of the insulating layer close to an outer edge of the display panel, and an anti-crack dam which covers the hollow structure and is disposed at a location of the hollow structure; wherein the hollow structure comprises multiple columns sequentially disposed at intervals;
the construction structure of the transition area comprises multiple columnar bodies which are sequentially disposed at intervals, and the first inorganic encapsulation layer covers the multiple columnar bodies to form the concave-convex structure in the transition area; the outer edge area comprises multiple banks which are sequentially disposed at intervals; the multiple columnar bodies and the multiple banks are arranged on a same layer;
the multiple banks comprises a first bank which is disposed on the insulating layer and closest to the organic encapsulation layer;
the display panel further comprises a second inorganic encapsulation layer, a horizontal straight line segment of the second inorganic encapsulation layer is located between the organic encapsulation layer and the first bank, closest to the organic encapsulation layer, of the multiple banks, the horizontal straight line segment is located at a side of all banks of the multiple banks, and a height of the horizontal straight line segment is less than all heights of all banks of the multiple banks, and the horizontal straight line segment separates the organic encapsulation layer from the first inorganic encapsulation layer covering all of the banks of the multiple banks.

11. The preparation method according to claim 10, wherein sequentially forming the construction structure and the first inorganic encapsulation layer located on the insulating layer in the transition area, the first inorganic encapsulation layer having the concave-convex structure, comprises:
forming a planarization film on the insulating layer, performing patterning processing on the planarization film, and forming a planarization layer located in the display area and a first structure layer located in the transition area, wherein the first structure layer is provided with a groove on a side facing the first inorganic encapsulation layer; and
forming the first inorganic encapsulation layer on the first structure layer, the first inorganic encapsulation layer having a concave-convex structure in the transition area.

12. The preparation method according to claim 11, wherein forming the first inorganic encapsulation layer on the first structure layer, the first inorganic encapsulation layer having the concave-convex structure in the transition area, comprises:
forming a pixel definition film on the planarization layer and the first structure layer, performing patterning processing on the pixel definition film, forming a pixel definition layer in the display area, and forming a second structure layer superposed on the first structure layer in the transition area, wherein the second structure layer comprises a columnar body, and the columnar body is located between two adjacent grooves, and
forming the first inorganic encapsulation layer on the pixel definition layer and the second structure layer, wherein the first inorganic encapsulation layer has a concave-convex structure in the transition area.

13. The preparation method according to claim 10, wherein sequentially forming the construction structure and the first inorganic encapsulation layer located on the insulating layer in the transition area, the first inorganic encapsulation layer having the concave-convex structure, comprise:

forming a planarization film on the insulating layer, performing patterning processing on the planarization film by using a halftone mask, removing part of the planarization film located in the display area to form a planarization layer, and removing part of the planarization film located in the transition area to form a first structure layer and a second structure layer located on a side of the first structure layer away from the insulating layer, wherein the first structure layer is provided with multiple grooves on a side facing the first inorganic encapsulation layer, the second structure layer comprises a columnar body, and the columnar body is located between two adjacent grooves;

forming a pixel definition film on the planarization layer and the second structure layer, performing patterning processing on the pixel definition film, forming a pixel definition layer located in the display area, and removing the pixel definition film in the transition area; and forming a first inorganic encapsulation layer on the pixel definition layer, wherein the first inorganic encapsulation layer has a concave-convex structure in the transition area.

14. The preparation method according to claim 10, wherein sequentially forming the construction structure and the first inorganic encapsulation layer located on the insulating layer in the transition area, the first inorganic encapsulation layer having the concave-convex structure, comprises:

sequentially forming a planarization film and a pixel definition film located on the insulating layer in the transition area;

performing patterning processing on the pixel definition film and the planarization film by using a halftone mask, and removing part of the pixel definition film and part of the planarization film in the transition area to form a first structure layer and a second structure layer located on a side of the first structure layer away from the insulating layer, wherein the first structure layer is provided with multiple grooves on a side facing the first inorganic encapsulation layer, the second structure layer comprises a columnar body, and the columnar body is located between two adjacent grooves; and forming the first inorganic encapsulation layer on the second structure layer, wherein the first inorganic encapsulation layer has a concave-convex structure in the transition area.

15. The preparation method according to claim 10, wherein sequentially forming the construction structure and the first inorganic encapsulation layer located on the insulating layer in the transition area, the first inorganic encapsulation layer having the concave-convex structure, comprises:

forming a planarization film on the insulating layer, performing patterning processing on the planarization film, reserving the planarization film in the display area to form a planarization layer, reserving the planarization film at a location of the construction structure to form a first structure layer, wherein a side of the first structure layer facing the first inorganic encapsulation layer has a planarized surface; and forming a pixel definition film on the planarization layer and the first structure layer, performing patterning processing on the pixel definition film, forming a pixel definition layer in the display area, and forming a second structure layer superposed on the first structure layer in the transition area, wherein the second structure layer comprises a columnar body, and the first inorganic encapsulation layer has a concave-convex structure.

16. The preparation method according to claim 10, wherein sequentially forming the construction structure and the first inorganic encapsulation layer located on the insulating layer in the transition area, the first inorganic encapsulation layer having the concave-convex structure, comprises:

forming a planarization film on the insulating layer, performing patterning processing on the planarization film, forming a planarization layer located in the display area, and removing a planarization film in the transition area; and forming a pixel definition film on the planarization layer, performing patterning processing on the pixel definition film, forming a pixel definition layer in the display area, and forming a second structure layer located on the insulating layer in the transition area, wherein the second structure layer comprises a columnar body, and the first inorganic encapsulation layer has a concave-convex structure.

17. A display apparatus, comprising a display panel, wherein the display panel comprises a display area and a frame area located at a side of the display area, the frame area comprises a transition area close to the display area and an outer edge area remote from the display area, the transition area of the display panel is of a structure comprising a base structure layer, an insulating layer disposed on the base structure layer, a construction structure disposed on the insulating layer, and a first inorganic encapsulation layer and an organic encapsulation layer sequentially disposed on the construction structure, and the first inorganic encapsulation layer has a concave-convex structure in the transition area; wherein the outer edge area comprises a hollow structure disposed at a location of the insulating layer close to an outer edge of the display panel, and an anti-crack dam which covers the hollow structure and is disposed at a location of the hollow structure; wherein the hollow structure comprises multiple columns sequentially disposed at intervals;

the construction structure of the transition area comprises multiple columnar bodies which are sequentially disposed at intervals, and the first inorganic encapsulation layer covers the multiple columnar bodies to form the concave-convex structure in the transition area; the outer edge area comprises multiple banks which are sequentially disposed at intervals; the multiple columnar bodies and the multiple banks are arranged on a same layer;

the multiple banks comprises a first bank which is disposed on the insulating layer and closest to the organic encapsulation layer;

the display panel further comprises a second inorganic encapsulation layer, a horizontal straight line segment of the second inorganic encapsulation layer is located between the organic encapsulation layer and the first bank, closest to the organic encapsulation layer, of the multiple banks, the horizontal straight line segment is located at a side of all banks of the multiple banks, and a height of the horizontal straight line segment is less than all heights of all banks of the multiple banks, and the horizontal straight line segment separates the organic encapsulation layer from the first inorganic encapsulation layer covering all of the banks of the multiple banks.

18. The display apparatus according to claim 17, wherein the construction structure comprises a first structure layer disposed on the insulating layer, the first structure layer is provided with a groove on a side facing the first inorganic encapsulation layer, and the first inorganic encapsulation layer has a concave-convex structure.

19. The display apparatus according to claim 17, wherein the construction structure comprises a first structure layer disposed on the insulating layer and a second structure layer disposed on a side of the first structure layer away from the insulating layer, a side of the first structure layer facing the first inorganic encapsulation layer has a planarized surface, the second structure layer comprises a columnar body, and the first inorganic encapsulation layer has a concave-convex structure.

20. The display apparatus according to claim 17, wherein
the construction structure comprises a second structure layer disposed on the insulating layer,
the second structure layer comprises the multiple columnar bodies which are sequentially disposed at intervals,
the first inorganic encapsulation layer has a concave-convex structure,
the display area of the display panel is of a structure comprising a base structure layer, a driving structure layer disposed on the base structure layer, a planarization layer disposed on the driving structure layer, and a pixel definition layer disposed on the planarization layer, and
the second structure layer is disposed on a same layer as the pixel definition layer.

* * * * *